(12) United States Patent
Xie et al.

(10) Patent No.: US 11,525,842 B2
(45) Date of Patent: Dec. 13, 2022

(54) MULTI-PURPOSE SENSORS USING CONDUCTIVE IONO-ELASTOMERS

(71) Applicant: UCHICAGO ARGONNE, LLC, Chicago, IL (US)

(72) Inventors: Yunsong Xie, Naperville, IL (US); Hao-Cheng Yang, Westmont, IL (US); Kaizhong Gao, North Oaks, MN (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 709 days.

(21) Appl. No.: 16/014,906

(22) Filed: Jun. 21, 2018

(65) Prior Publication Data

US 2019/0391181 A1    Dec. 26, 2019

(51) Int. Cl.
| | |
|---|---|
| *G01K 7/02* | (2021.01) |
| *G01R 1/04* | (2006.01) |
| *G01R 1/20* | (2006.01) |
| *G01K 7/18* | (2006.01) |

(52) U.S. Cl.
CPC .............. *G01R 1/203* (2013.01); *G01K 7/021* (2013.01); *G01K 7/183* (2013.01); *G01R 1/04* (2013.01)

(58) Field of Classification Search
CPC .......... G01R 1/203; G01R 1/04; G01K 7/021; G01K 7/183; G01K 7/223; A61B 5/6806; A61B 5/0002; A61B 5/11; A61B 5/1107; A61B 5/1126; A61B 5/6833; A61B 2560/0214; A61B 2562/0261; C08F 299/028; C08L 53/005; C08L 2203/02; H01G 9/022; H01G 11/58; A41D 19/0024; H01M 10/425; H01M 2220/30; Y02E 60/10

See application file for complete search history.

(56) References Cited

U.S. PATENT DOCUMENTS

| | | | |
|---|---|---|---|
| 10,654,486 B2 * | 5/2020 | McMillen | B60W 40/09 |
| 2009/0240001 A1 | 9/2009 | Regner | |
| 2010/0158544 A1 * | 6/2010 | Chabinyc | G03G 15/55 399/9 |

(Continued)

FOREIGN PATENT DOCUMENTS

| | | |
|---|---|---|
| CN | 106057956 A * | 10/2016 |
| WO | WO-2015/077559 A1 | 5/2015 |

(Continued)

OTHER PUBLICATIONS

3M VHB Tapes (Year: 2013).*

(Continued)

*Primary Examiner* — Lisa M Caputo
*Assistant Examiner* — Janice M Soto
(74) *Attorney, Agent, or Firm* — Marshall, Gerstein & Borun LLP

(57) ABSTRACT

A sensor module includes a first contact, a second contact, and a sensing element made from an iono-conductive material having a conductivity that varies at least in response to variations in an environmental factor. The sensing element is electrically coupled to the first contact and to the second contact, and a first resistance of the sensing element, measured between the first contact and the second contact, varies in response to the variations in the environmental factor.

19 Claims, 13 Drawing Sheets

(56) References Cited

U.S. PATENT DOCUMENTS

| | | | | |
|---|---|---|---|---|
| 2010/0288635 A1* | 11/2010 | Komiya | G01B 7/16 | |
| | | | 204/406 | |
| 2013/0089717 A1* | 4/2013 | Loffelmann | C09D 11/101 | |
| | | | 428/195.1 | |
| 2014/0238153 A1* | 8/2014 | Wood | B25J 13/08 | |
| | | | 73/862.627 | |
| 2016/0025669 A1* | 1/2016 | Sun | G01N 27/305 | |
| | | | 205/790.5 | |
| 2016/0069811 A1 | 3/2016 | Rabolt et al. | | |
| 2016/0290880 A1 | 10/2016 | Lewis et al. | | |
| 2017/0059421 A1 | 3/2017 | Servati et al. | | |
| 2017/0234745 A1* | 8/2017 | Choi | B60C 23/064 | |
| | | | 73/146.3 | |
| 2017/0356815 A1* | 12/2017 | Madden | A61B 5/0205 | |
| 2018/0340847 A1* | 11/2018 | Pan | B32B 5/024 | |
| 2019/0231265 A1* | 8/2019 | Lopez-Barron | A61B 5/0002 | |

FOREIGN PATENT DOCUMENTS

| | | |
|---|---|---|
| WO | WO-2016/123651 A1 | 8/2016 |
| WO | WO-2018048479 A1 | 3/2018 |

OTHER PUBLICATIONS

López-Barron, Carlos R.; Chen, Ru; Wagner, Norman J. (2016): Ultrastretchable Iono-Elastomers with Mechanoelectrical Response. ACS Publications. Journal contribution, https://doi.org/10.1021/acsmacrolett.6b00790.s001 (Year: 2016).*

Kaltenbrunner et al., "An ultra-lightweight design for imperceptible plastic electronics," *Nature*, vol. 499 (2013).

Rogers et al., "Materials and Mechanics for Strechable Electronics," *Science*, vol. 327 (2010).

Sekitani et al., "A Rubberlike Stretchable Active Matrix Using Elastic Conductors," *Science*, vol. 321 (2008).

Song et al., "Strain-induced water dissociation on supported ultrathin oxide films," *Scientific Reports*, (2016).

Viventi et al., "A Conformal, Bio-Interfaced Class of Silicon Electronics for Mapping Cardiac Electrophysiology," www.ScienceTranslationMedicine.org, vol. 2, Issue 24 (2010).

Yuk et al., "Skin-inspired hydrogel-elastomer hybrids with robust interfaces and functional microstructures," *Nature Communications*, (2016).

Lopez-Barron et al., "Self-Assembly of Pluronic F127 Diacrylate in Ethylammonium Nitrate: Structure, Rheology, and Ionic Conductivitiy before and after Photo-Cross-Linking," *Macromolecules*, vol. 49 (2016).

Lopez-Barron et al., "Triblock Copolymer Self-Assembly in Ionic Liquid: Effect of PEO Block Length on the Self-Assembly of PEO-PPO-PEO in Ethylammonium Nitrate," *Macromolecules*, vol. 47 (2014).

* cited by examiner

MULTI-PURPOSE SENSORS USING CONDUCTIVE IONO-ELASTOMERS

STATEMENT REGARDING FEDERALLY SPONSORED RESEARCH OR DEVELOPMENT

This invention was made with government support under Contract No. DE-AC02-06CH11357, awarded by the United States Department of Energy to UChicago Argonne, LLC, operator of Argonne National Laboratory. The government has certain rights in the invention.

FIELD OF THE DISCLOSURE

The present disclosure relates to wearable sensor technology and, in particular, to a novel wearable sensor based on conductive iono-elastomers, and a method of manufacturing the same.

BACKGROUND

An explosion in data storage, data processing, communication, and sensing technologies is rapidly changing the way that humanity acquires, processes, and uses data. Some of the manifestations of this change is the rapid growth of such endeavors and fields of knowledge as the Internet of Things (IoT), wearable technologies, big data, and smart structures, robotics, autonomous machines. As a result, there is a growing demand for accurate and inexpensive sensors that can be integrated into a variety of systems and that supply the data for a variety of uses.

Some emerging applications of wearable sensor technology include detection of motion ranging in complexity from counting steps to full motion capture ("mo-cap"), with mid-range applications including gesture recognition. The applications include entertainment, sports performance, fitness, as well as a variety of life-style improvement and therapeutic applications. Additionally, integration of sensor inputs with virtual and enhanced reality promises to considerably advance human-machine interactions.

The sensors that enable good capture of motion as well as other biometric and environmental variables at low cost can considerably speed up the adoption of a variety of wearable technologies. Mechanical properties of the sensors, such as durability under repeated deformation as well as flexibility, elasticity, and deformability are important to enable seamless integration into wearable platforms.

Elastomers have emerged as promising materials for integrating sensing technologies into deformable and stretchable platforms, such as clothes, specialized gloves, etc. Conductive elastomers that include conductive solids such as metals or graphite distributed throughout the polymer matrix are included in a variety of products.

More recently, iono-elastomers have been investigated for sensor applications. These materials encapsulate conductive liquid within a polymer matrix. Sensors made of iono-elastomers and exhibiting mechano-electrical response to deformation have been reported.

A need remains, however, to develop flexible sensors for measuring environmental parameters in addition to mechanical deformations.

SUMMARY OF THE DISCLOSURE

The presently disclosed embodiments address the need of creating flexible sensors that can be integrated into wearable platforms.

In an embodiment, a sensor module includes a first contact, a second contact, and a sensing element made from an iono-conductive material having a conductivity that varies at least in response to variations in an environment factor. The sensing element is electrically coupled to the first contact and to the second contact, and a first resistance of the sensing element, measured between the first contact and the second contact, varies in response to the variations in the environmental factor.

In various embodiments, the environmental factor may be one of temperature, humidity, spectral irradiance, atmospheric pressure, and partial vapor pressure of a chemical solvent. The chemical solvent may be one or more of the group consisting of ethanol, methanol, isopropanol, acetone, ethyl acetate, and a water-miscable solvent.

An encapsulation layer that is impervious to moisture may encapsulate a first portion of the sensing element that extends between the first and second contacts, in embodiments.

In embodiments, the sensor module may include a third contact disposed on a second substrate, and the third contact may be electrically coupled to the sensing element. A second resistance of the sensing element, measured between the first contact and the third contact, may vary in response to strain or deformation of a second portion of the sensing element extending between the first contact and the third contact. Further, the sensor module may include an encapsulation layer that encapsulates a second portion of the sensing element that extends between the first contact and the third contact, and may exhibit the property of being elastic.

BRIEF DESCRIPTION OF THE DRAWINGS

The following detailed description will be more easily and better understood when considered in conjunction with the following figures, in which like reference numbers are employed to designate like structures. It should be understood that, with the exception of magnified images, the drawings are not to scale, as scaled drawings would not facilitate an understanding of the depicted structures.

DETAILED DESCRIPTION

A sensor according to the present description includes an iono-elastomer sensing element exhibiting conductivity that varies according to its deformation and according to one or more environmental factors. As used herein, the term "iono-elastomer" refers to an electrically conductive elastomeric material exhibiting an electrical response (e.g., a change in conductivity) in response to mechanical strain or deformation and at least one environmental factor, and which comprises and owes its conductivity to an ionic liquid that may be disposed throughout the element. As used herein, the term "elastomeric" refers to the characteristic of a polymer having viscoelasticity, relatively low Young's modulus, and relatively high failure strain. The iono-elastomers described in the present application, in embodiments, exhibit elastic deformation, and are capable of repeated deformation, while returning to their original form.

Figure 1:
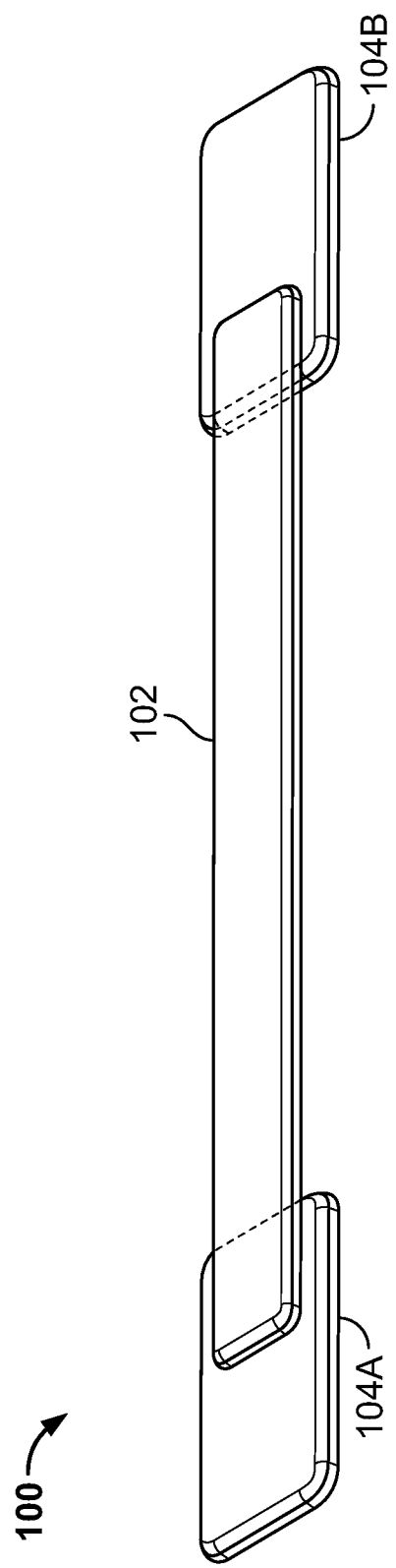
FIG. 1 illustrates a sensor sub-assembly including the basic elements of a sensor constructed according to the present description.

FIG. 1 illustrates a sensor sub-assembly 100 including the most basic elements of the sensors described throughout this description. The sub-assembly 100 includes an iono-elastomer sensing element 102 (hereinafter referred to simply as a "sensing element," for convenience), and two contacts 104A and 104B. The sensor element 102 is mechanically and electrically coupled to the contacts 104A and 104B, resulting in a bi-directional electrically conductive path from the contact 104A to the contact 104B. At various points in this description, the contacts 104A and 104B (as well as other contacts referred to in various embodiments) may be referred to by ordinal number (e.g., first contact, second contact, etc.); however, such references are intended only for ease of distinguishing between two or more contacts, and do not reflect any ordinal priority or establish any particular order. Additionally, the contacts 104A and 104B may be referred to as ground contacts, ground electrodes, reference contacts, reference electrodes, signal contacts, signal electrodes, etc. However, as will be generally understood in view of the description, an electrode referred to as a "ground electrode" may be, but need not necessarily be, at ground potential for the purposes of measuring resistance between the contacts 104A and 104B.

While depicted in FIG. 1 as elongated, the sensing element 102 need not be confined to any particular shape, and the shape of the sensing element 102 may differ according to the particular need.

As described above, the iono-elastomer of which the sensing element 102 is formed includes an ionic liquid that contributes to the conductivity exhibited by the iono-elastomer. In some embodiments, the ionic liquid may be mixed with one or more solvents that comprise neutral liquids, such as water, ethanol, methanol, isopropanol, acetone, ethyl acetate, etc. The sensor element may contain an ionic liquid or a mixture in a gel suspension, a polymer matrix, or another non-liquid material with micro-structure or macro-structure containing the liquid. One exemplary structure for containing an ionic liquid, an elastomer polymer matrix, may show properties, such as deformability, elasticity, and stretch-ability that may be beneficial in a variety of applications.

In embodiments, an ultra-stretchable iono-elastomer with resistance sensitive to both elongation strain and temperature has been developed by self-assembly of tri-block copolymer in a protic ionic liquid ethylammonium nitrate followed by cross-linking. The material can be intensively stretched and produces resistance change upon both physical deformation and subtle temperature variation. The long polymer chains act as bridges connecting the dispersed micelles to enables a large stretchability of the elastomer, which is also a basic requirement of wearable sensors. At the same time, the high conductive activation energy of ethylammonium nitrate (~12 kJ/mol [27]) bestows a highly temperature sensitive resistivity of $\Delta R/R \leq 1.6\%/° C$. @ $30°$ C., which can be even further increased by self-assembling micelles in ionic liquid.

In embodiments, sensing element 102 is formed of F127-ethylammonium nitrate constituted iono-elastomer. By self-assembly of Pluronic F127 diacrylate in ethylammonium nitrate followed by chemical crosslinking, an ultra-stretchable sensing material can be easily obtained from which to form the sensing element 102.

Small Angle X-ray Scattering (SAXS) characterization performed on the material during uniaxial elongation revealed the behavior of the interior hierarchically self-assembled cross-linked micelles. The results show that the inter-micelle distance extends along the deformation direction while the micelles aligned to a long-range ordered face-center-cubic (FCC) structure during the uniaxial elongation. This iono-elastomer exhibits large stretchability of 340% and a two-stage microstructure transition during uniaxial elongation. The sensing element 102, when formed from such a material, is imbued with superior strain sensing accuracy, fast strain response, good stability/reliability, highly linear resistance vs. elongation strain (R2=0.998), and stable functionality undergoing minor physical damage including impaling, scratching, and cutting. More importantly, because the iono-transfer of the iono-elastomer is highly promoted by a raised temperature, the sensing element 102, when formed of this material exhibits impressively high temperature sensitivity for stretchable temperature sensing materials ($\Delta R/R \geq 3.24\%/° C$. @ $30°$ C.).

Figure 2:
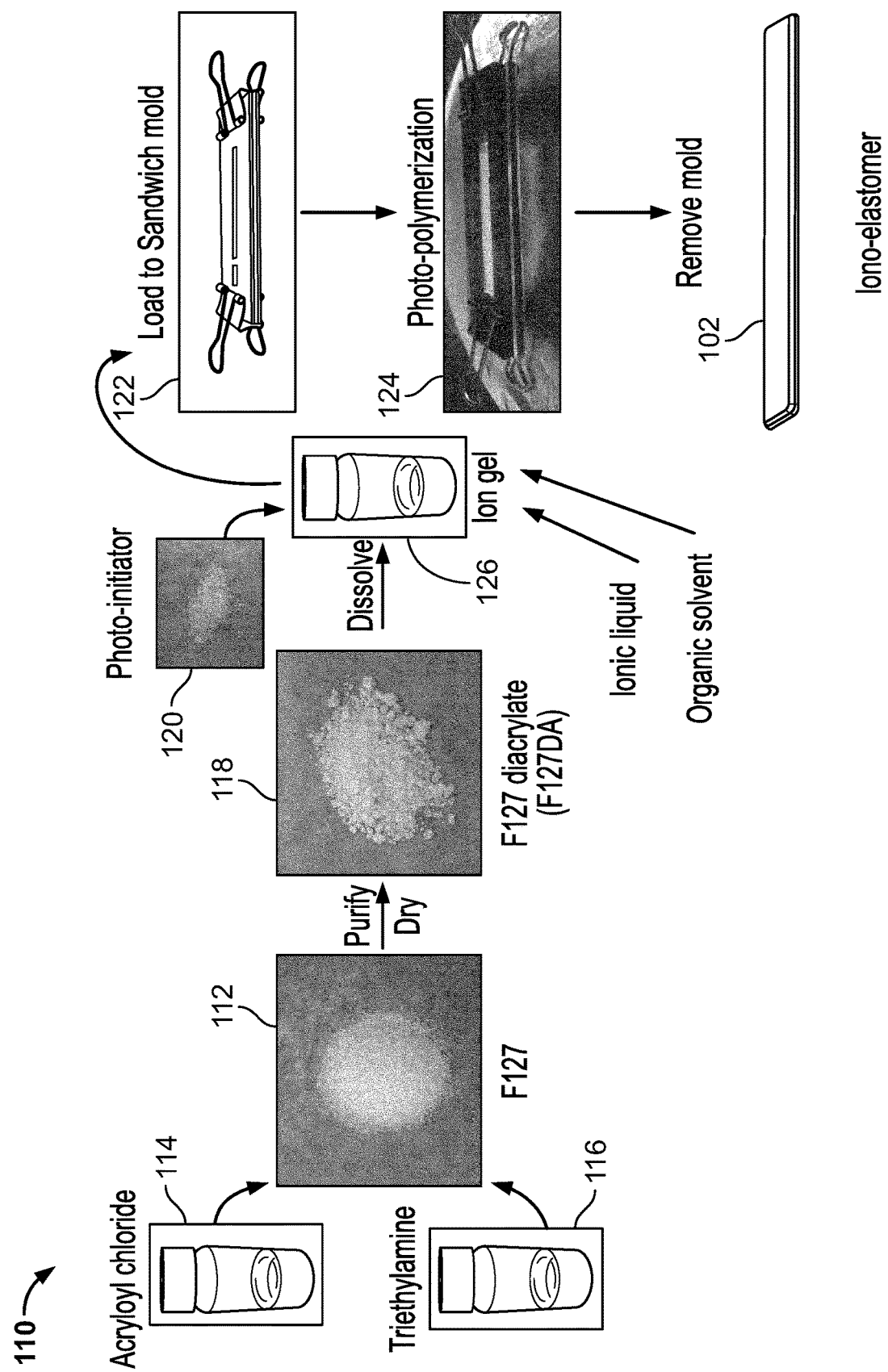
FIG. 2 illustrates an example process for creating an iono-elastomeric sensing element as depicted in FIG. 1.

With reference now to FIG. 2, which illustrates an exemplary process 110 for creating an iono-elastomeric sensing element such as the sensing element 102, the iono-elastomer may be composed of functionalized Pluronic® F127 (a commercial triblock polymer produced by BASF Corporation) 112 and ethylammonium nitrate (EAN) (a protic ionic liquid comprising, e.g., acryloyl chloride 114 and triethlamine 116). Pluronic® F127 may be end-functionalized with acrylic groups (abbreviated as F127DA 118) for post UV crosslinking. Functional groups with double bonds can also be used. In such embodiments, driven by thermodynamics, the F127DA 118 self-assembles in EAN to form micelles, which further self-assemble at higher concentration to exhibit an inverse gel transition with heating. An ionic gel 126, comprising an ionic liquid and an organic solvent, may be added to the F127DA/EAN to form the iono-elastomeric material. By way of example and not limitation, conductive solvents may include water with added salts, acids, bases or other ionic species, proplene carbonate, a protic liquid, a protic ionic liquid, an aprotic ionic liquid, etc. When the ionic gel 126 is fabricated using dried or deuterated ionic liquid as the solvent, it may form F127-DA/$d_3$EAN, as described, for example in WIPO publication WO 2018/048479. To tune the properties of the iono-elastomer, varying levels of solvents, including water, ethanol, methanol, isopropanol, acetone, ethyl acetate, other water-miscible solvents, etc., may be added to the ionic liquid to achieve the desirable performance. However, in particular embodiments, the ionic gel 126 is fabricated using water, it may form F127-DA/hEAN. In any event, the iono-elastomer may be fabricated by simply casting the F127DA/xEAN 118 and photo-initiator 120 mixture into a mold 122 with desired shape followed by UV crosslinking 124.

Figure 3B:
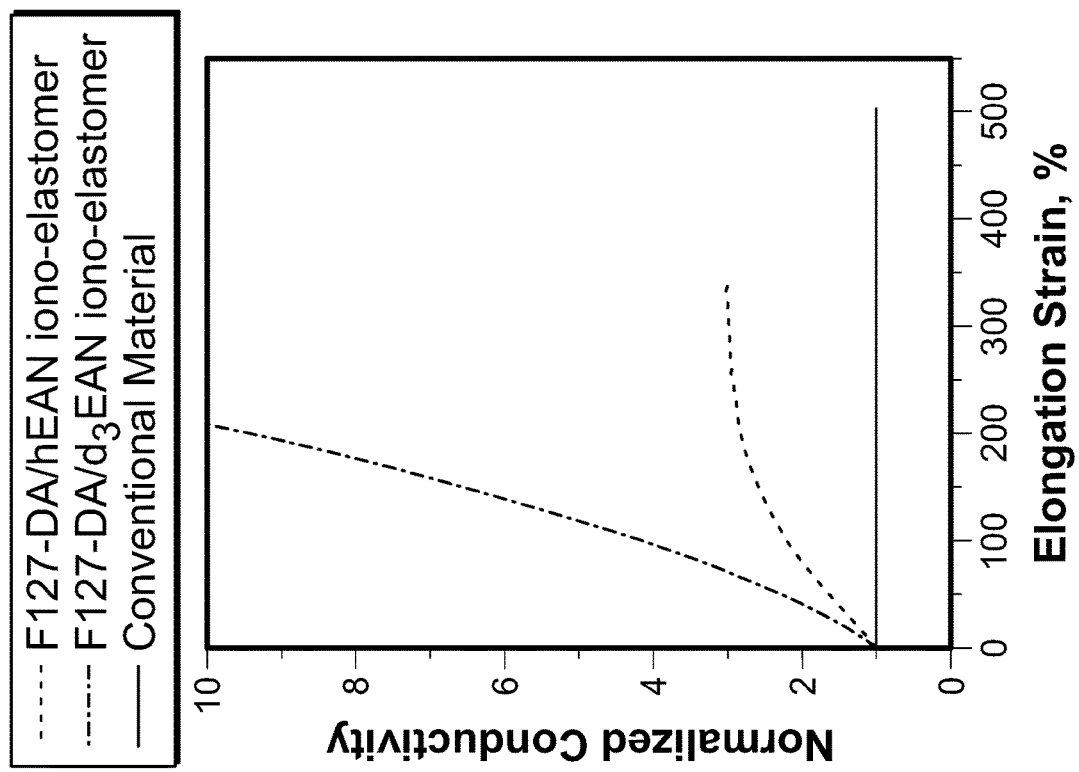
FIGS. 3A and 3B depict graphs of normalized electrical resistance and conductivity as a function of strain for two different iono-elastomeric materials.
Figure 3A:
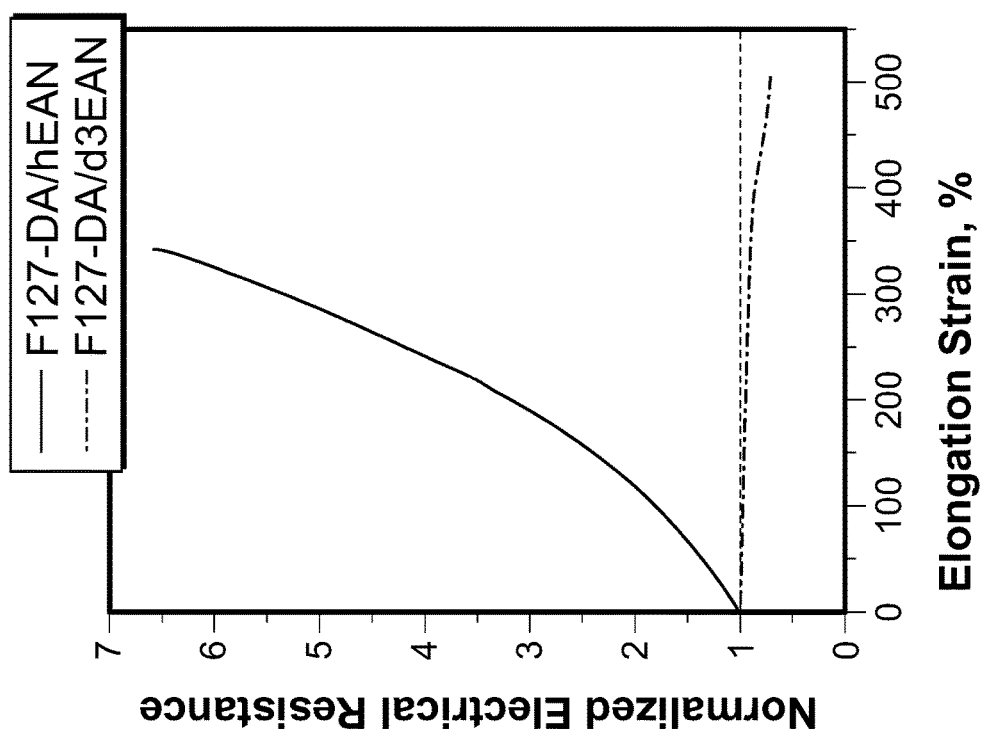

FIGS. 3A and 3B depict normalized electrical resistance and normalized conductivity, respectively, as a function of elongation strain applied to two iono-elastomeric materials. As illustrated in FIGS. 3A and 3B, the content of the ionic gel added to the F127-DA/xEAN can drastically affect the characteristics of the conductivity and resistance curves. Compared to F127-DA/$d_3$EAN, F127-DA/hEAN exhibits superior characteristics in terms of conductivity and electrical resistance as a function of elongation strain and, in particular, exhibits a greater sensitivity (improved by more than 15× at 100% strain) to strain and deformation than F127-DA/$d_3$EAN, allowing the former to more accurately measure smaller movements.

In a strain sensor application, the sensitivity and accuracy are two of the most important figures of merit to evaluate strain sensing performance. Historically, because a linear relation is normally assumed between the elongation strain and resistance, the sensitivity and accuracy of the strain detection are highly related to the strain/resistance gauge factor (the slope of resistance/strain response) and linearity of the strain sensing material. However, large gauge factor of the sensing material is not the only route to a high strain detection sensitivity. In a physical sensor, as long as a linearity relation has been preassumed, a higher linearity of the sensing response is a preferred way to improve detection accuracy.

The iono-elastomer made from F127-DA/hEAN delivers an exceptionally linear resistance/strain response by nature. Unlike some alternative materials with high gauge factor, in which the resistance change is produced by microscopic cracks and breakage, the continuous and repeatable resistance change of the F127-DA/hEAN iono-elastomer is the result of reversible shape deformation of a continuous and homogenous matrix. The real-time repeated resistance response curve of this iono-elastomer was collected through a consecutive loading-unloading repeating tests. The results indicate that even under a large range of stress (1.25%~100%), the developed iono-elastomer gives a linear and repeatable resistance change output. More importantly, analysis reveals that even under strain amplitudes as long as 100%, the relation between the resistance and strain ratio has a linearity $R^2$ (statistically measures how close the distribution follows the linear model) value of 0.998. This value is the highest among known stretchable strain sensors with ≥50% stretchability.

The reliability and robustness of the sensing element 102 has also been tested in cycling experiments. In the tests, four iono-elastomeric elements were subjected to different physical damage processes, including repeated strain, rubbed with 150 grit sand paper, pinched by needle, and cut along a longitudinal direction by a sharp blade. For each situation, the iono-elastomeric elements were monitored while experiencing a 55% strain ratio over 1000-consecutive loading-unloading stretching cycles. All four samples survived the corresponding mechanical damage. Although the punctured and cut samples suffered from a small drop in gain at the start of cycling, follow a negative exponential curve, and become stable after 400 cycles. This behavior can be explained by cycling causing some local rearrangement and "annealing" of the microstructure, as well as some inter-micelle linking breakage, to obtain a more stable structure during the first hundred cycles.

Figure 4:
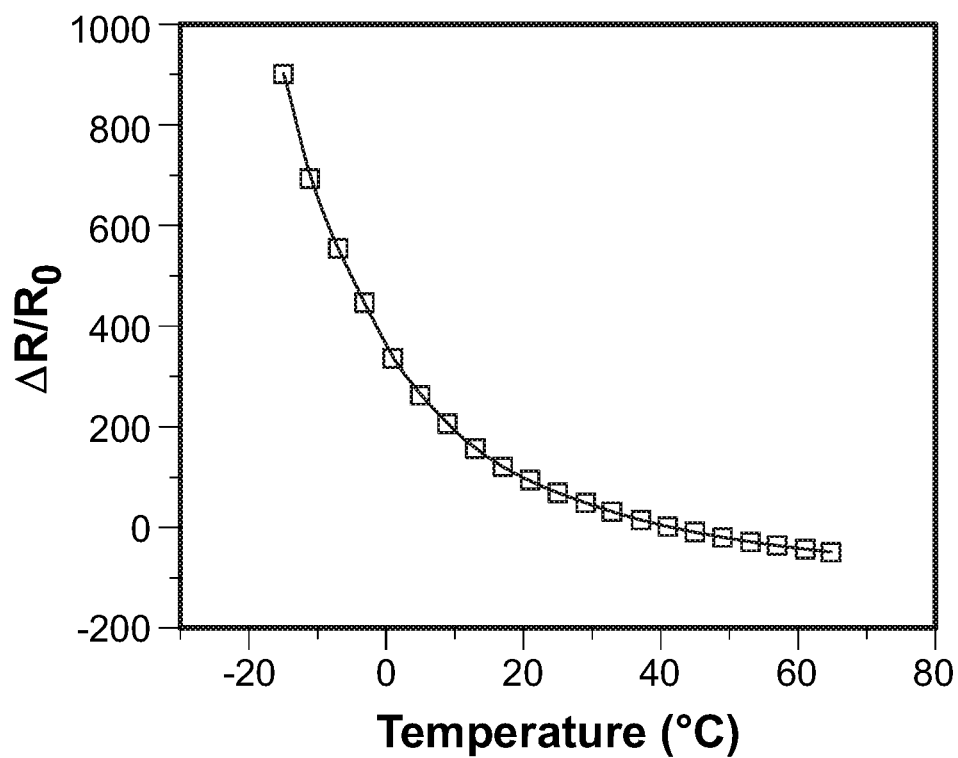
FIG. 4 depicts a graph of normalized resistance as a function of temperature for the described iono-elastomeric material.

Besides strain sensing, the temperature detection capability is one of the most unique properties of the iono-elastomer formed from F127-DA/hEAN. The temperature/resistance relation of the developed iono-elastomer has been characterized between −15° C. and 65° C. and is depicted in FIG. 4. The result illustrates a highly sensitive and predictable temperature/resistance response throughout the considered temperature range. The temperature gauge factor at 25° C. reads $\Delta R/R=3.24\%/°$ C., which is twice as high comparing to all the previously reported resistance based stretchable temperature sensing materials.

As one may by now appreciate, the addition of water to the iono-elastomer results in a change in the characteristic resistance and conductivity responses of the iono-elastomer as a result of strain and temperature. Accordingly, adjustment of the amount of water present in the iono-elastomer, for example by adding it to the ionic liquid, or exposing it in the mold to humid air, may be employed as a method to fine-tune the characteristic response according to the desired use and/or the desired sensitivity of the sensing element 102 to temperature and/or strain and/or deformation. Advantageously, exposing the completed iono-elastomer to moisture after removing it from the mold may also fine-tune characteristic response of the iono-elastomer. As a result, in embodiments, the sensing element 102 using the iono-elastomer may be employed as a humidity sensor by tracking the change in resistance of an exposed portion of the iono-elastomeric material. In various embodiments, a sensor configured to sense humidity may or may not be reusable, depending on the iono-elastomer employed as the sensing element.

An iono-conductive sensing element with favorable properties for wearable electronics, including flexibility, deformability, and elasticity, may be fabricated from a hydrogel, ion gel, or iono-elastomer. In the foregoing (and following) discussion, a consistent reference to iono-elastomer sensing elements is for the purpose of clarity, and not intended to limit the possible implementations.

Figure 5A:
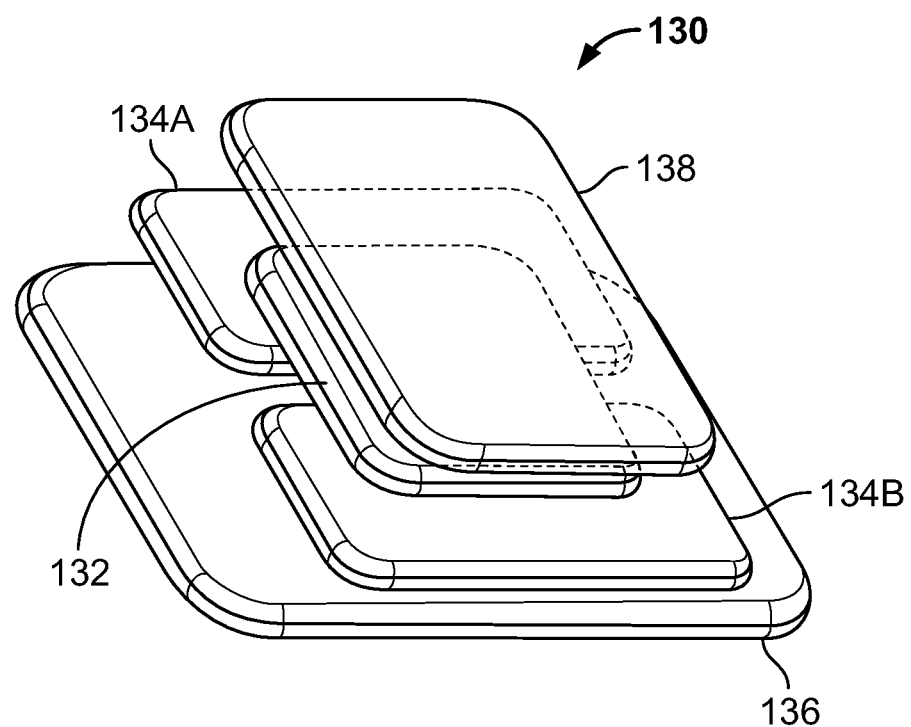
FIG. 5A illustrates a first example temperature sensor in accordance with the present description.

Various exemplary embodiments of sensor assemblies employing the iono-elastomeric sensing elements described herein will now be described. Turning to FIG. 5A, an example sensor assembly 130 for sensing temperature is illustrated. The sensor assembly 130 includes a sensing element 132 electrically and mechanically coupled to contacts 134A and 134B. The contacts 134A and 134B are disposed on a non-conductive substrate 136. The use of a single substrate supporting the contacts 134A and 134B, and the sensing element 132, prevents the sensing element 132 from being exposed to strain or deformation, ensuring that the conductivity of the sensing element 132 (and the resistance value between the contacts 134A and 134B) does not vary according to strain or deformation. At the same time, a moisture and/or air-tight encapsulating layer 138 prevents the sensing element 132 from being exposed to humidity that might alter the conductivity of the sensing element 132. By measuring the resistance between the contact 134A and the contact 134B, a measure of the change of temperature may be determined.

In the sensor assembly 130, and throughout other embodiments described hereafter, the contacts in sensor embodiments (e.g., the contacts 134A and 134B) may be made from a variety of conducting materials, such as metals and alloys (e.g., steel, copper, gold, etc.), conducting plastics, conducting fabrics, and graphite-based materials. In embodiments, graphite-based materials are preferred, as the ionic materials in the iono-elastomer have the potential corrode metallic contacts. In fact, a variety of materials are suitable for the first electrode 100 including, by way of example and not limitation, copper (Cu), cobalt (Co), iron (Fe), nickel (Ni), chromium (Cr), iron-cobalt alloys (CoFe), iron-nickel alloys (NiFe), silver (Ag), gold (Au), platinum (Pt), and other alloys including these materials; carbon (C), porous carbon, graphite, graphene, metal-doped carbon, porous metal-doped carbon, and graphene thin layers. The substrates described herein (e.g., the substrate 136) may be made from a rigid or somewhat deformable electrically non-conducting material. Suitable substrate materials can include, by way of example and not limitation, ceramic, a plastic such as polyethylene terephthalate (PET), rubber, thermoplastic vulcanizates (TPV), polyethylene, polypropylene, polyimide, Teflon™, or Nylon.

As mentioned above, the sensing element (e.g., the sensing element 132) may be fully or partially protected from direct exposure to the environment by an encapsulating layer (e.g., the encapsulating layer 138). The encapsulating layer can be made from any material suitable for the protection desired. By way of example and not limitation, the encapsulating layer may, in embodiments, be a deformable acrylic elastomer tape, such as VHB tape, manufactured by 3M. The encapsulating layer can be applied to the sensing element with an adhesive, or it may be coated onto the sensing element directly. The encapsulating layer may be made from a variety of materials, including elastomers or non-elastomers (depending, for example, on whether the sensing element is measuring strain and/or deformation) that may or may not comprise the same polymer blocks as the sensing element. Optical properties of the encapsulating layer may also affect response of the sensor to illumination at various wavelengths, in some embodiments, for example by changing the amount of thermal energy to which the sensing element is exposed.

Figure 5B:
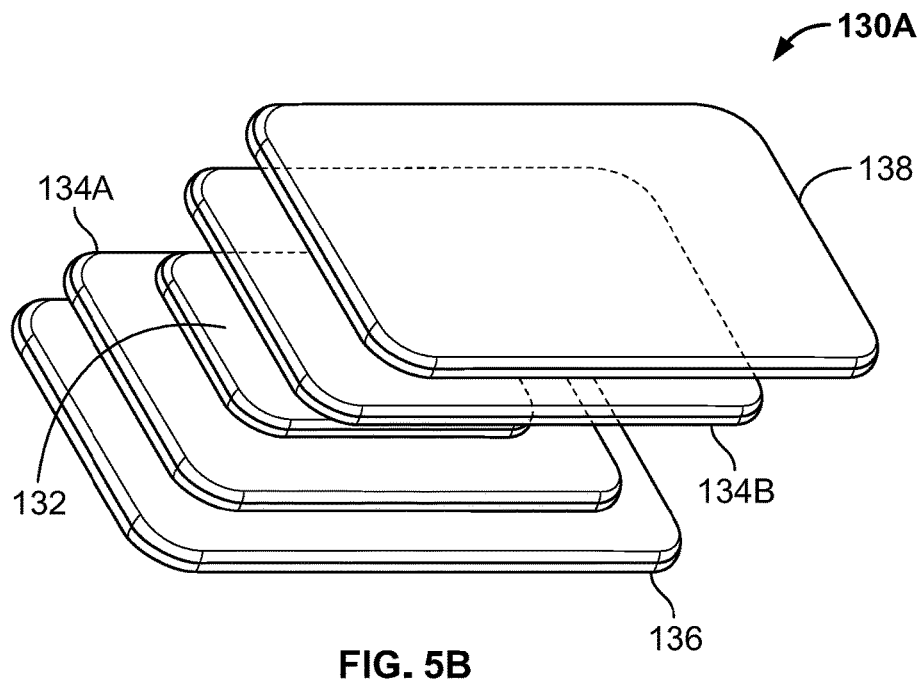
FIG. 5B illustrates a second example temperature sensor in accordance with the present description.

FIG. 5B illustrates a second example embodiment of a temperature sensor 130A in accordance with the description. The primary difference between the temperature sensor 130 and the temperature sensor 130A is that rather than the sensing element 132 being on top of the contacts 134A and 134B, as in FIG. 5A, the sensing element 132 in FIG. 5B is sandwiched between the contacts 134A and 134B. Of course, because the sensing element 132 is not exposed to the atmosphere in the arrangement of FIG. 5B, the encapsulating layer 138 may be omitted, in embodiments. While only depicted with respect to the temperature sensor 130/130A in FIGS. 5A and 5B, the arrangement of a sensing element sandwiched between two contacts may also be employed in other sensing embodiments, as will be readily appreciated in view of the present disclosure.

Figure 6:
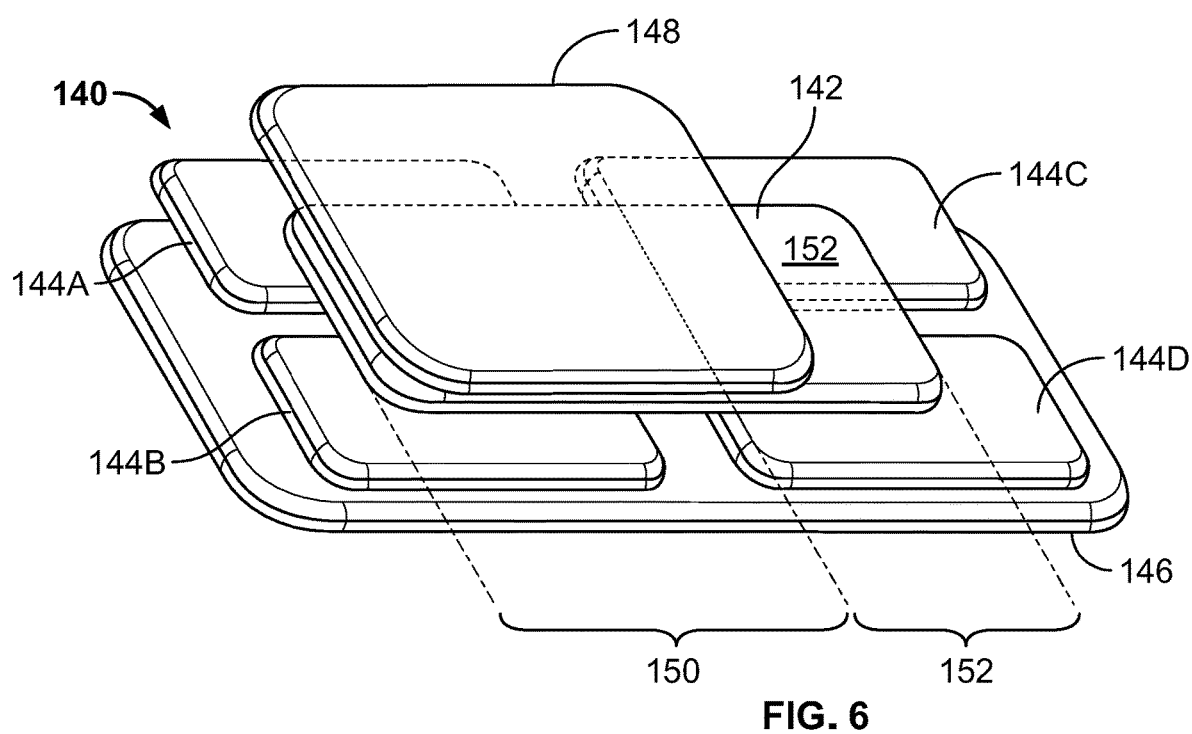
FIG. 6 illustrates an example sensor for sensing temperature and humidity in accordance with the present description.

FIG. 6 illustrates an example sensor assembly 140 configured to sense humidity and temperature. Like the sensor assembly 130, the sensor assembly 140 includes a non-conductive substrate 146 configured to prevent strain or deformation of an iono-elastomeric sensing element 142 and the contacts to which it is coupled. In the sensor assembly 140, the sensing element 142 is electrically and mechanically coupled to four contacts 144A-D. However, in contrast to the sensor assembly 130, in which the entirety of the sensing element 132 is covered by the encapsulating layer 138, in the sensor assembly 140, an encapsulating layer 148 covers only a portion 150 of the sensing element 142 extending between the contact 144A and the contact 144B, and leaves exposed a portion 152 of the sensing element 142 between the contact 144C and the contact 144B. Accordingly, the portion 150 of the sensing element 142 is not exposed to humidity and, just as in the sensor assembly 130, the conductivity of the portion 150 of the sensing element 142 varies according only to temperature. In contrast, the portion 152 of the sensing element 142 is exposed to humidity and its conductivity varies according to both temperature and humidity.

Thus, by measuring resistance between specific pairs of the contacts 144A-D, different parameters of the environment may be measured. Specifically, measuring the resistance between the contacts 144A and 144B provides information related to the temperature of the sensor assembly 140, while measuring the resistance between the contacts 144C and 144D provides information related to the combination of temperature and humidity experienced by the sensor assembly 140. By measuring across both pairs of contacts (144A-B and 144C-D), the temperature signal (measured across contacts 144A and 144B) can be removed from the humidity-temperature signal (measured across contacts 144C and 144D) to determine the signal accordingly to humidity alone.

Figure 7:
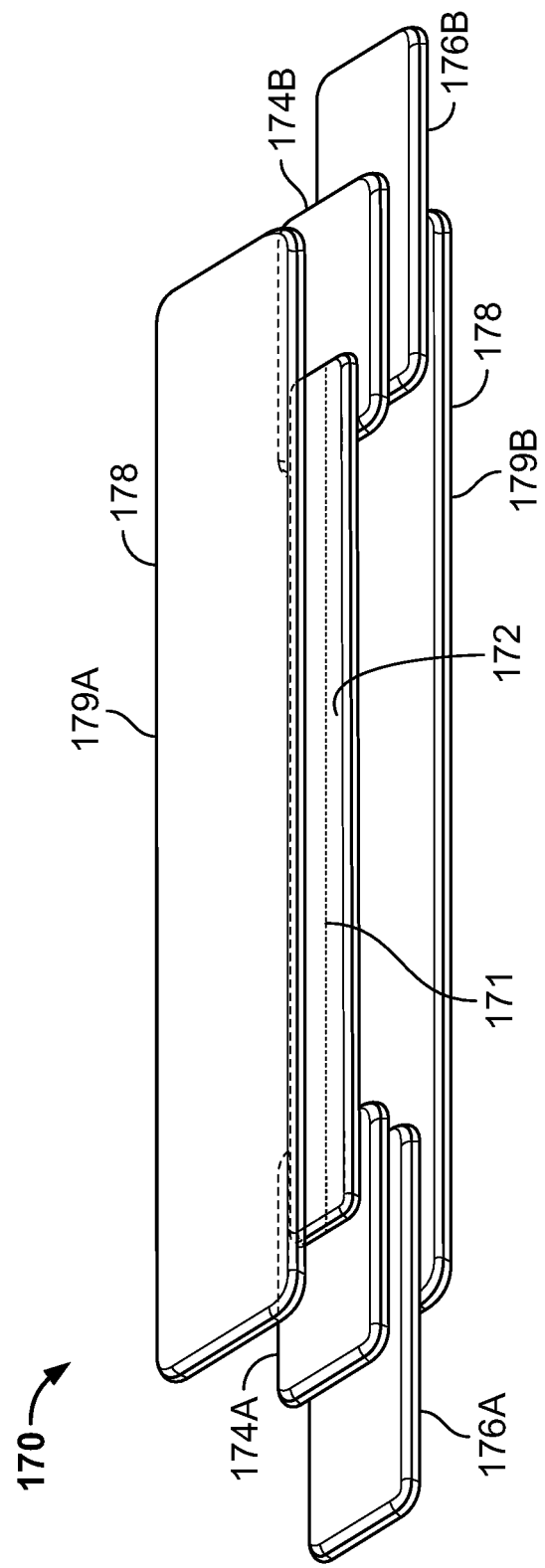
FIG. 7 illustrates an example strain sensor in accordance with the present description.

FIG. 7 illustrates an example sensor assembly 170 configured to sense strain and/or deformation. Like the sensor assemblies 130 and 140, the sensor assembly 170 includes a sensing element 172 electrically and mechanically coupled to contacts 174 And 174B. However, in contrast to the sensor assemblies 130 and 140, the contacts 174A and 174B are not on a single substrate in the sensor assembly 170, but are instead on respective substrates 176A and 176B, allowing the contacts 174A and 174B to move relative to one another and, consequently, not constraining the deformation and/or strain of the sensing element 172. In order to prevent the effects of humidity from causing a change in the conductivity of the sensing element 172, an encapsulating layer 178 is included, as in previous embodiments, covering the entirety of the sensing element 172. As illustrated in FIG. 7, the encapsulating layer 178 may be two separate components 179A and 179B that come together to sandwich the sensing element 172. By way of example, the encapsulating layer 178 may comprise two layers 179A and 179B of VHB tape, as VHB tape is elastic in nature, and will stretch and/or deform with the sensing element 172. By measuring the resistance between the contact 174A and the contact 174B, a measure of the strain or deformation of the sensing element 172 may be determined.

In FIG. 7, the sensing element 172 is depicted as elongated along a longitudinal axis 171. As may be understood, facilitating strain or deformation along (i.e., parallel to) a longitudinal axis, as depicted in FIG. 7, provides a wider range of motion. However, the sensor assembly 170 would also function if the sensing element 172 were configured to sense strain or deformation perpendicular to the longitudinal axis 171, as the iono-elastomeric material from which the sensing element 172 is formed is agnostic as to orientation—the conductivity of the material will vary according to the strain along any axis extending from one contact to another. By way of example, for a given rectangular sensing element having a length and a width, stretching the sensing element to twice its length will change the resistance between contacts at placed at either end of its length the same amount as stretching the sensing element to twice its width will change the resistance between contacts placed at either end of its width.

Figure 8:
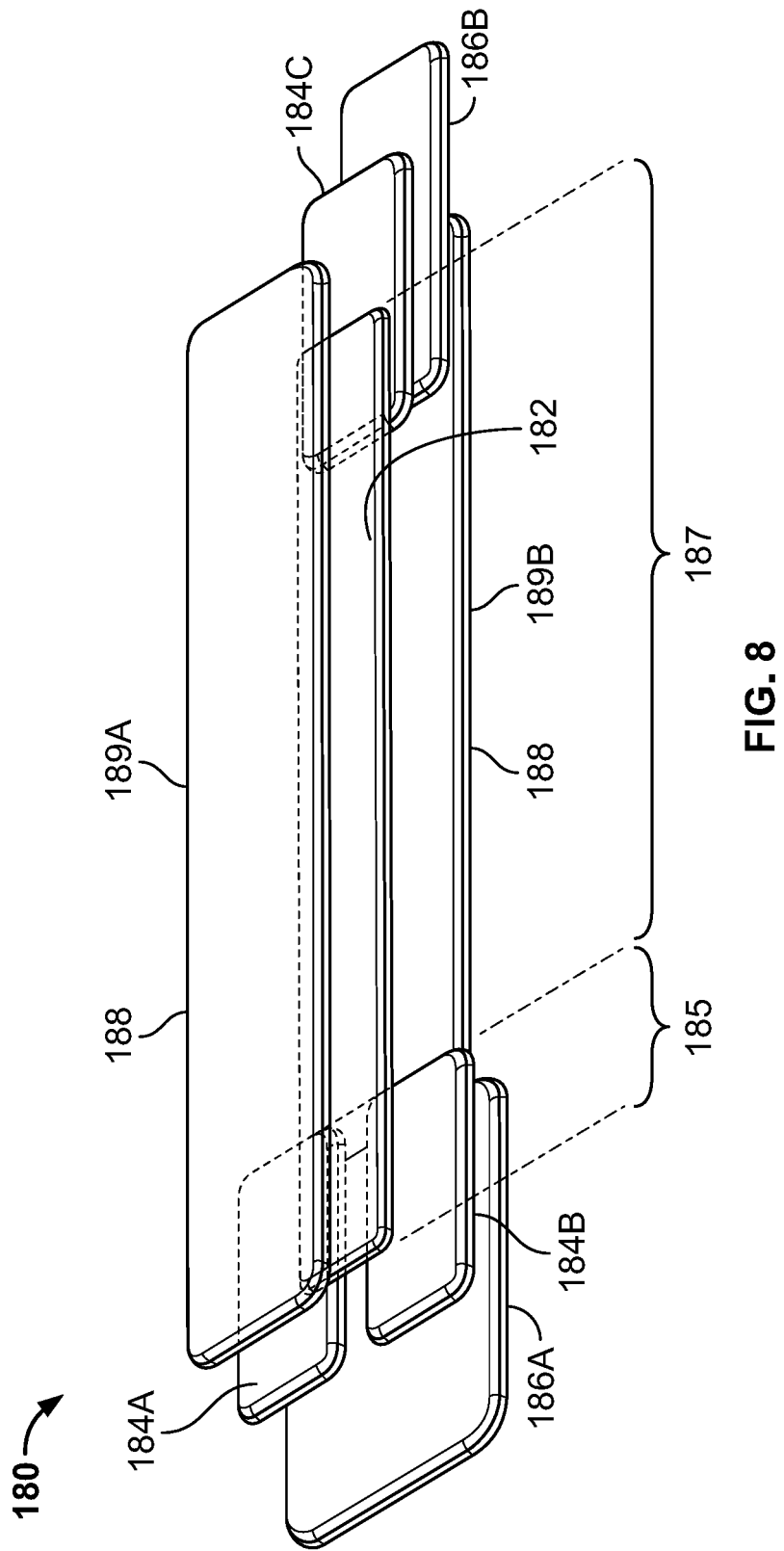
FIG. 8 illustrates an example sensor for measuring strain and temperature in accordance with the present description.

A sensor assembly 180, combining features and functionality of the temperature sensor assembly 130 and the strain sensor assembly 170, is illustrated in FIG. 8. As in the sensor assembly 130, the sensor assembly 180 includes a sensing element 182 electrically and mechanically coupled to two contacts 184A and 184B supported by a single substrate 186A. However, in the sensor assembly 180, the sensing element 182 is also coupled electrically and mechanically to a third contact 184C supported on a second substrate 186B. The sensing element 182 is protected by an encapsulating layer 188 covering the entirety of the sensing element 182. Once again, the encapsulating layer 178 may be two separate components 189A and 189B, in embodiments, that come together to sandwich the sensing element 182. By way of example, the encapsulating layer 188 may comprise two layers 189A and 189B of VHB tape.

Because the contacts 184A and 184B are supported by the same substrate, the sensing element 182 will experience little or no deformation or strain in a portion 185 between the contacts 184A and 184B. At the same time, the contacts 184A and 184B are on the substrate 186A that is separate from the substrate 186B on which the contact 184C is disposed, allowing a portion 187 of the sensing element 182 to be stretched and otherwise deformed. The conductivity of the portion 187 of the sensing element 182 reacts, of course, to both temperature and strain. Accordingly, by measuring the resistance between the contact 184A and the contact 184B, a measure of the temperature of the sensing element 182 may be determined, while, by measuring the resistance between the contact 184C and either of the contacts 184A and 184B, a measure of the strain or deformation of the sensing element 182 may be determined by post-processing the output from both electrodes following a simple decoupling algorithm that removes the temperature signal from the signal received by measuring the resistance between the contact 184C and either of the contacts 184A and 184B.

Figure 9:
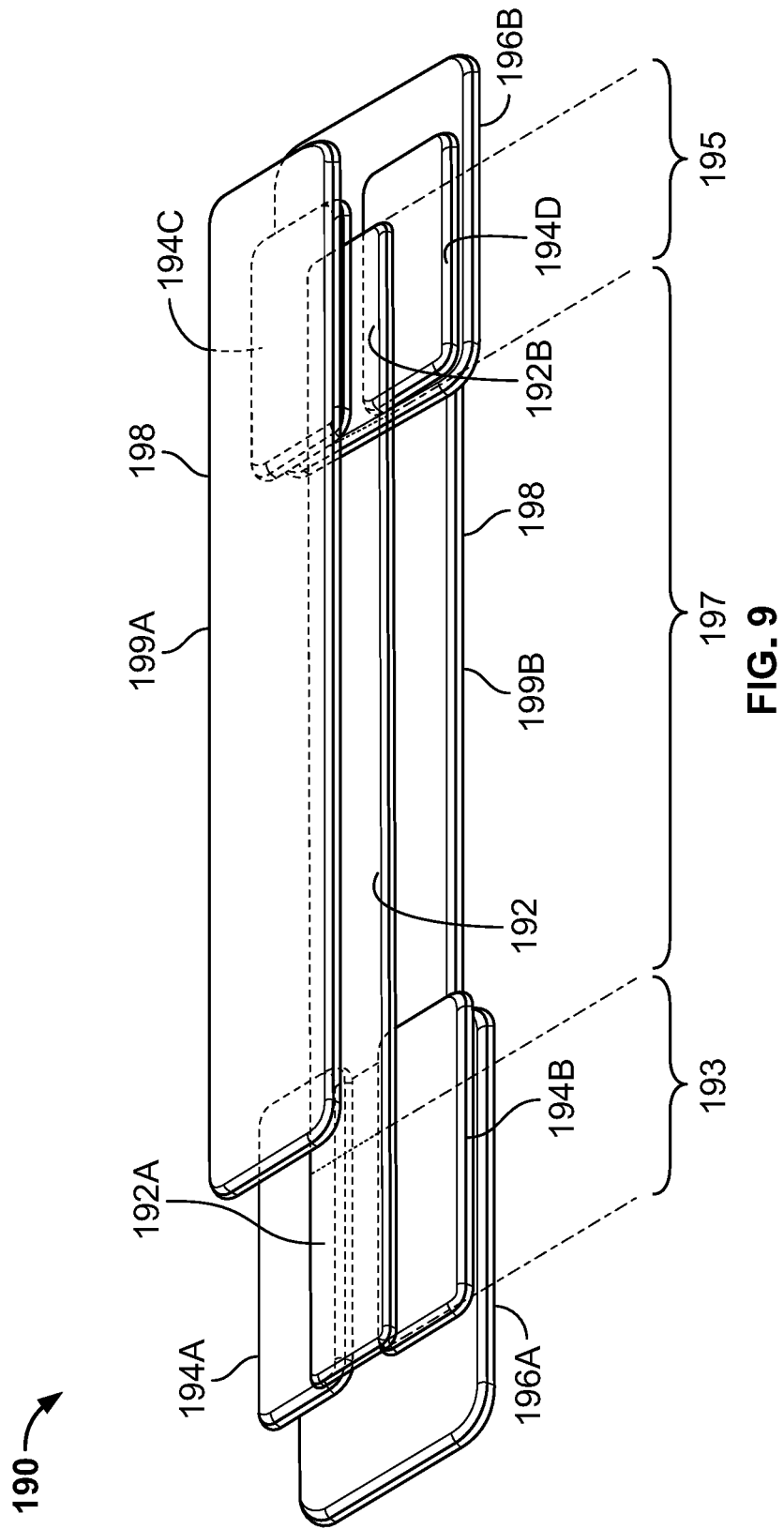
FIG. 9 illustrates an example sensor for measuring strain, temperature, and humidity in accordance with the present description.

FIG. 9 illustrates an example sensor assembly 190 incorporating the features of the sensor assemblies of FIGS. 5-8. In particular, the sensor assembly 190 is configured to facilitate measurement of strain and/or deformation, temperature, and humidity. An sensing element 192 is electrically and mechanically coupled to two contacts 194A and 194B at a first end 192A of the sensing element 192, and to two additional contacts 194C and 194D at a second end 192B of the sensing element 192. A substrate 196A supports the contacts 194A and 194B, while a second substrate 196B supports the contacts 194C and 194D, such that the two substrates 196A and 196B are movable relative to one another, allowing the sensing element 192 to be deformed and strained between the two substrates 196A and 196B.

The sensing element 192 is protected by an encapsulating layer 198 covering the a portion 195 of the sensing element 192 between the contacts 194C and 194D, and a portion 197 of the sensing element 192 extending between the two substrates 196A and 196B. A portion 193 of the sensing element 192, extending between the contacts 194A and 194B remains uncovered by the encapsulating layer 198, exposing the portion 193 to the environment and, in particular, to humidity. As described above, the encapsulating layer 198 may be two separate components 199A and 199B, in embodiments, that come together to sandwich the sensing element 192. By way of example, the encapsulating layer 198 may comprise two layers 199A and 199B of VHB tape.

The contacts 194A and 194B being supported by the same substrate 196A, the sensing element 192 will experience little or no deformation or strain in the portion 193 between the contacts 194A and 194B. Accordingly, the resistance between the contacts 194A and 194B will be affected only by humidity and temperature. At the same time, the contacts 194C and 194D are on the substrate 196B and, thus, the sensing element 192 will experience little or no deformation or strain in the portion 195 between the contacts 194C and 194D. Because the section 195 of the sensing element 192 is protected by the encapsulating layer 198, the resistance between the contacts 194C and 194D will be affected only by the ambient temperature.

Of course, because the substrates 196A and 196 are separate, a portion 197 of the sensing element 192 may be stretched and otherwise deformed. Accordingly, by measuring the resistance between one of the contacts 194A and 194B on the substrate 196A, and one of the contacts 194C and 194D on the substrate 196B, a measure of the strain or deformation of the sensing element 192 may be determined.

Figure 10:
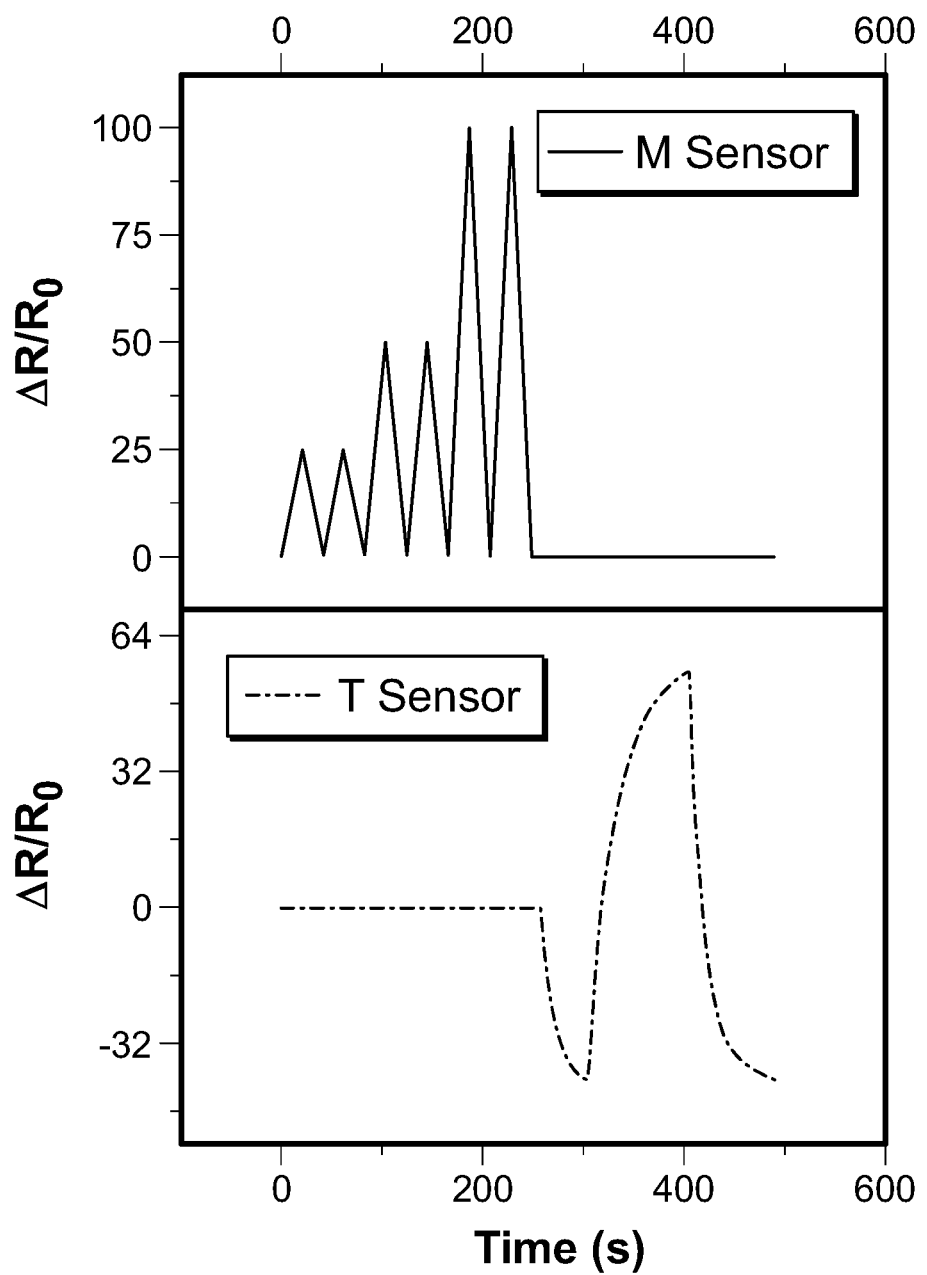
FIG. 10 illustrates the independence of strain/deformation measurements from temperature measurements in a sensor according to FIG. 8, for example.

FIG. 10 depicts an example graph demonstrating the independence of the strain/deformation measurements from temperature measurements when, for example, the sensors of FIG. 8 or 9 are used. The top graph in FIG. 10 represents change in resistance as a function of strain or deformation over time, while the bottom graph in FIG. 10 represents change in resistance as a function of temperature over time. With reference to FIG. 8, the top graph in FIG. 10 would be generated according to the measured resistance between the contact 184C and one of the contacts 184A or 184B, while the bottom graph in FIG. 10 would be generated according to the measured resistance between the contacts 184A and 184B. As the graphs demonstrate, strain or deformation of the portion 187 of the sensing element 182 does not cause the resistance between the contacts 184A and 184B to change, while change in the temperature of the portion 185 of the sensing element 182 can allow the change in resistance due to temperature to be removed from the measured signal between the contacts 184C and 184A or 184B.

While described throughout this specification with respect to a sensing element configured to measure temperature, humidity, and/or strain/deformation, a sensing element may be configured to have conductivity that depends on one or a combination of a variety of environmental factors. The environmental factors may include temperature, humidity, air flow, spectral irradiance, atmospheric pressure, or partial vapor pressure of a chemical solvent. The effect of spectral irradiance, for example, may be configured to a certain band of wavelengths, such as ultraviolet light by, for example, tuning optical transmittance or permeability of an encapsulating layer to enable sensing of spectral irradiance or a variety of chemicals in the environment. Furthermore, a resistance between contacts connected by a sensing element may depend on the deformation of the sensing element. Thus, even without an appreciable effect on conductivity, the sensor resistance may be affected by the sensor element geometry under the exerted forces.

Figure 11A:
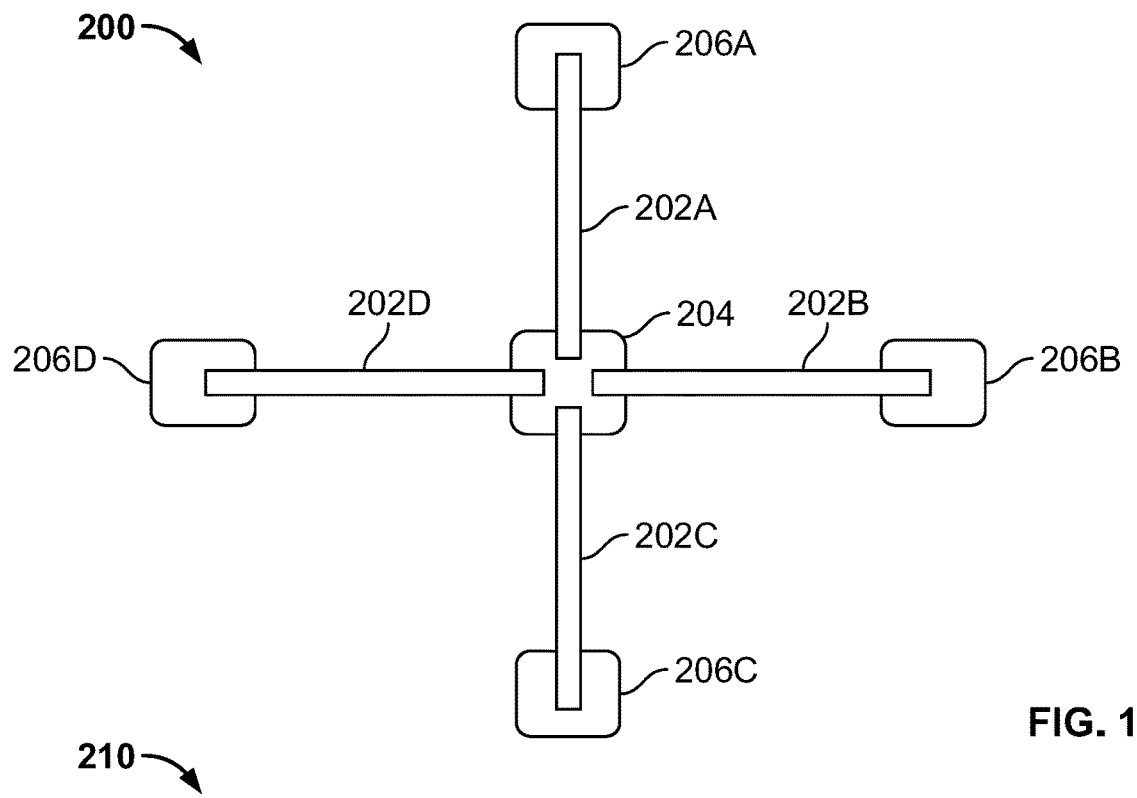
FIGS. 11A to 11E depict various example networks of sensors.

Moreover, while described above with respect to particular embodiments employing a single sensing element electrically and mechanically coupled to a set of contacts, it should be apparent that the sensor assemblies described herein are amenable to configuration as sensor networks, as depicted, for example in FIGS. 11A-11D. That is, by employing additional contacts, sensing elements, and circuitry, and selectively sharing contacts between sensing elements and the like the sensors may be arranged into a mesh of elements. Such configurations may enable simultaneous measurements of a variety of factors across a surface. Single and meshed sensors can be integrated onto a variety of platforms, enabling wearable sensor networks and a variety of smart structures. For instance, FIG. 11A depicts a sensor network 200 including four sensing elements 202A-D arranged around a single ground or reference contact 204 and extending, respectively, between signal contacts 206A-D. By way of example, but certainly not limitation, the sensor network 200 may measure strain in multiple directions from a central point.

Figure 11B:
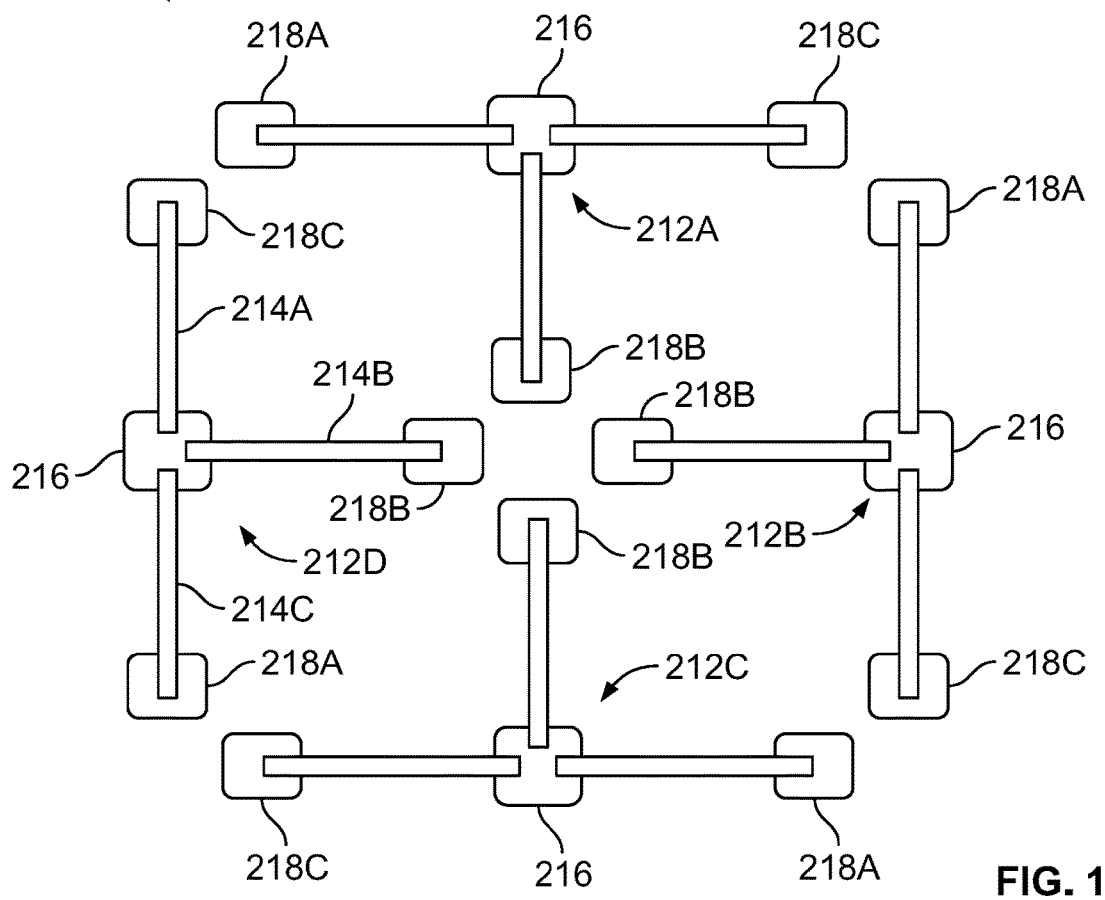
Figure 11C:
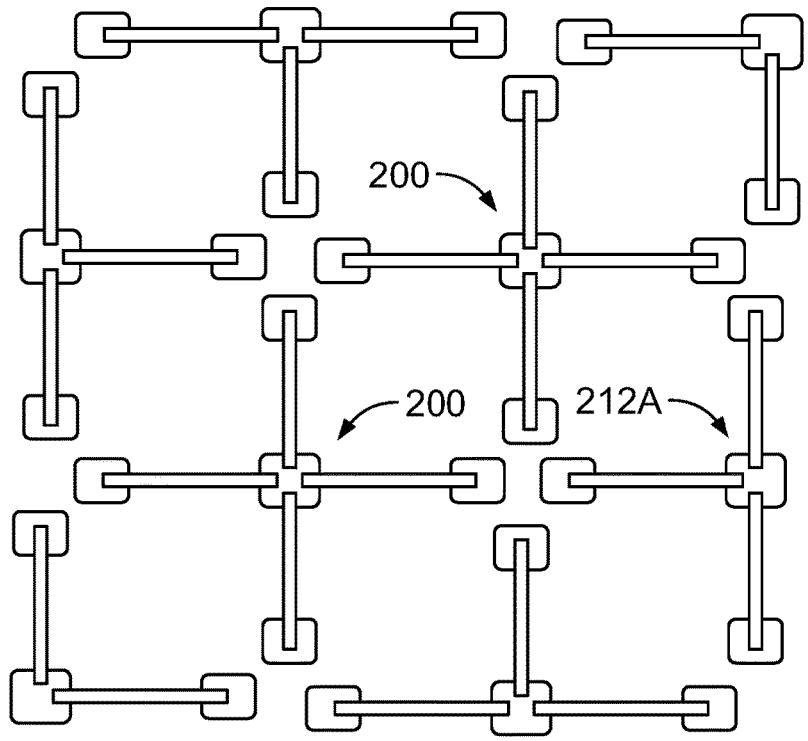
Figure 11D:
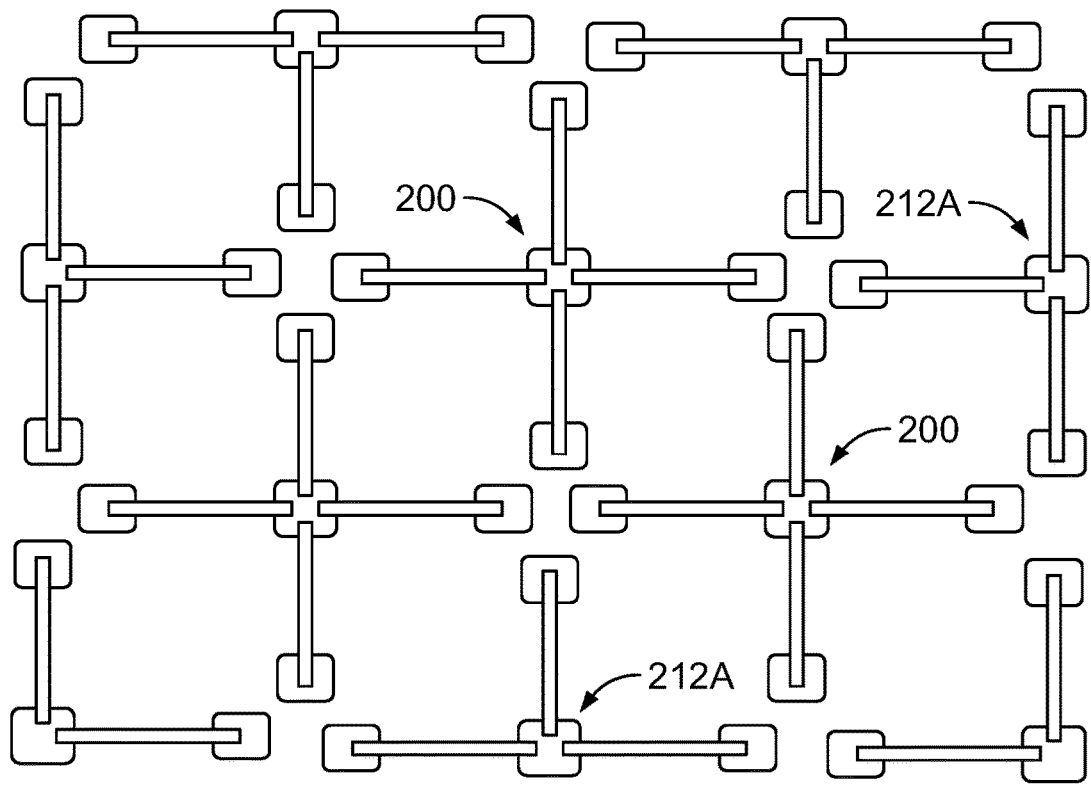
Figure 11E:
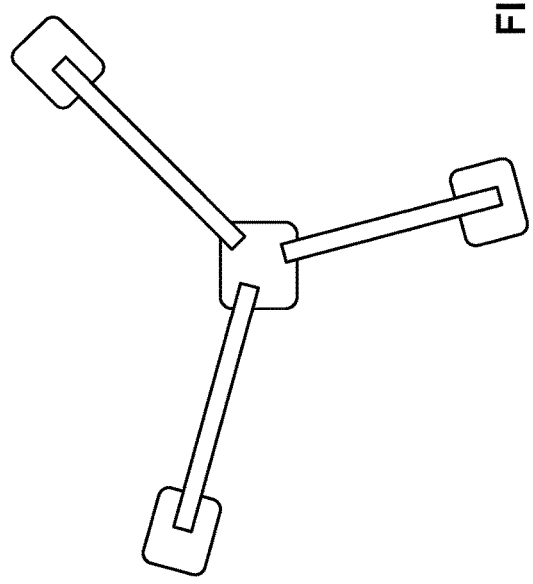

Myriad other sensor network topographies may be envisioned but, of course, an exhaustive accounting of all possible topographies would be impractical. FIGS. 11B-D provide a few examples, however. In FIG. 11B, a sensor network 210 includes four sub-networks 212A-D. Each of the sub-networks 212A-D includes three sensor elements 214A-C arranged around a respective single reference contact 216 and extending between the respective reference contact 216 for the sub-network 212A-D and respective signal contacts 218A-C for each sensor 214A-C of the sub-network 212A-D. In FIGS. 11C and 11D, various arrangements of the networks 200 and 212A are combined (along with other arrangements) to form additional exemplary sensor network topologies. In still other examples, one of which is depicted in FIG. 11E, the sensing elements need not be at 90 degree angles with respect to one another, but can be at any desired angle with respect to one another. In the example of FIG. 11E, the sensing elements are at approximately 120 degrees with respect to one another. Additionally, there is no requirement that the sensing elements be at equally-spaced angles (see, e.g., sub-network 212B in FIG. 11B, in which sensing elements are at 90 degree angles or 180 degree angles with respect to adjacent sensing elements).

Figure 12:
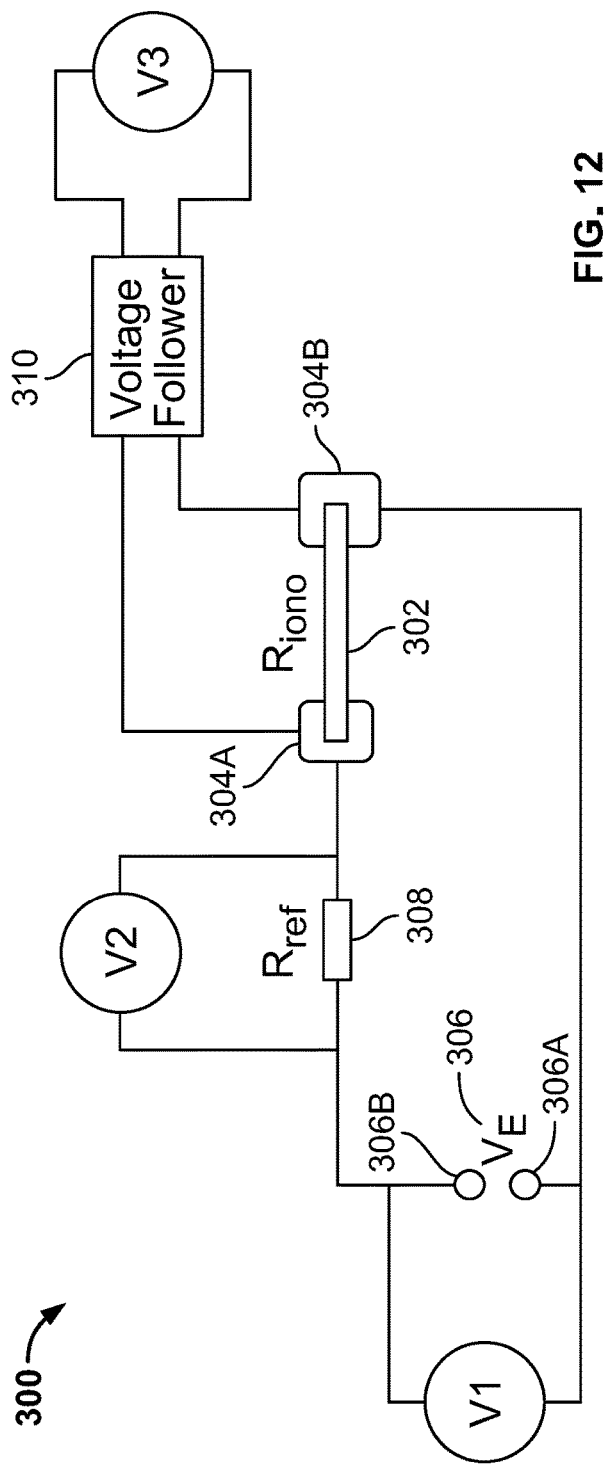
FIG. 12 illustrates an example circuit for measuring resistance of one of the sensors described in the present description.

Measurement of the resistance across any individual sensing element can be accomplished by a variety of circuits, one of which is illustrated in FIG. 12. The circuit 300 depicted in FIG. 12 includes a sensing element 302 coupled to a signal contact 304A and a reference contact 304B. A voltage source 306 is electrically coupled in parallel with the sensing element 302, such that a negative/ground terminal 306A of the voltage source 306 is electrically coupled to the reference contact 304B, and a positive terminal 306B of the voltage source 306 is electrically coupled to the signal contact 304A. In the embodiment depicted in FIG. 12, a reference resistor 308 is electrically coupled in series between the positive terminal 306B of the voltage source 306 and the signal contact 304A, while a voltage follower circuit 310 is electrically coupled in parallel with the sensing element 302. The resistance of the sensing element 302 may be measured by determining the voltage across any two of: the voltage source 306, the reference resistor 308, and a voltage follower circuit 310, according to the following equations:

$$R_{302} = R_{308}\frac{V_{310}}{V_{306} - V_{310}} = R_{308}\frac{V_{310}}{V_{308}} = R_{308}\frac{V_{306} - V_{308}}{V_{308}} \quad (Eq.\ 1)$$

where $R_{308}$ denotes the resistance of the reference resistor 308, $R_{302}$ denotes the resistance of the sensing element 302, and $V_{306}$, $V_{308}$, and $V_{310}$ represent, respectively, the voltages across the voltage source 306, the reference resistor 308, and the voltage follower circuit 310. In various embodiments, the voltage may be an AC voltage signal or a DC voltage signal. In embodiments, the voltage is an AC signal, as the use of an AC signal reduces output signal drifting. In such embodiments, the contact between the iono-elastomer sensing element 302 and the signal contact 304A and/or reference contact 304B forms a capacitor and, whereas DC voltage would cause slow charging, AC voltage overcomes the slow charging limitation. The capacitance effectively becomes a shorted line under an AC signal so that the signal is much more stable.

Figure 13:
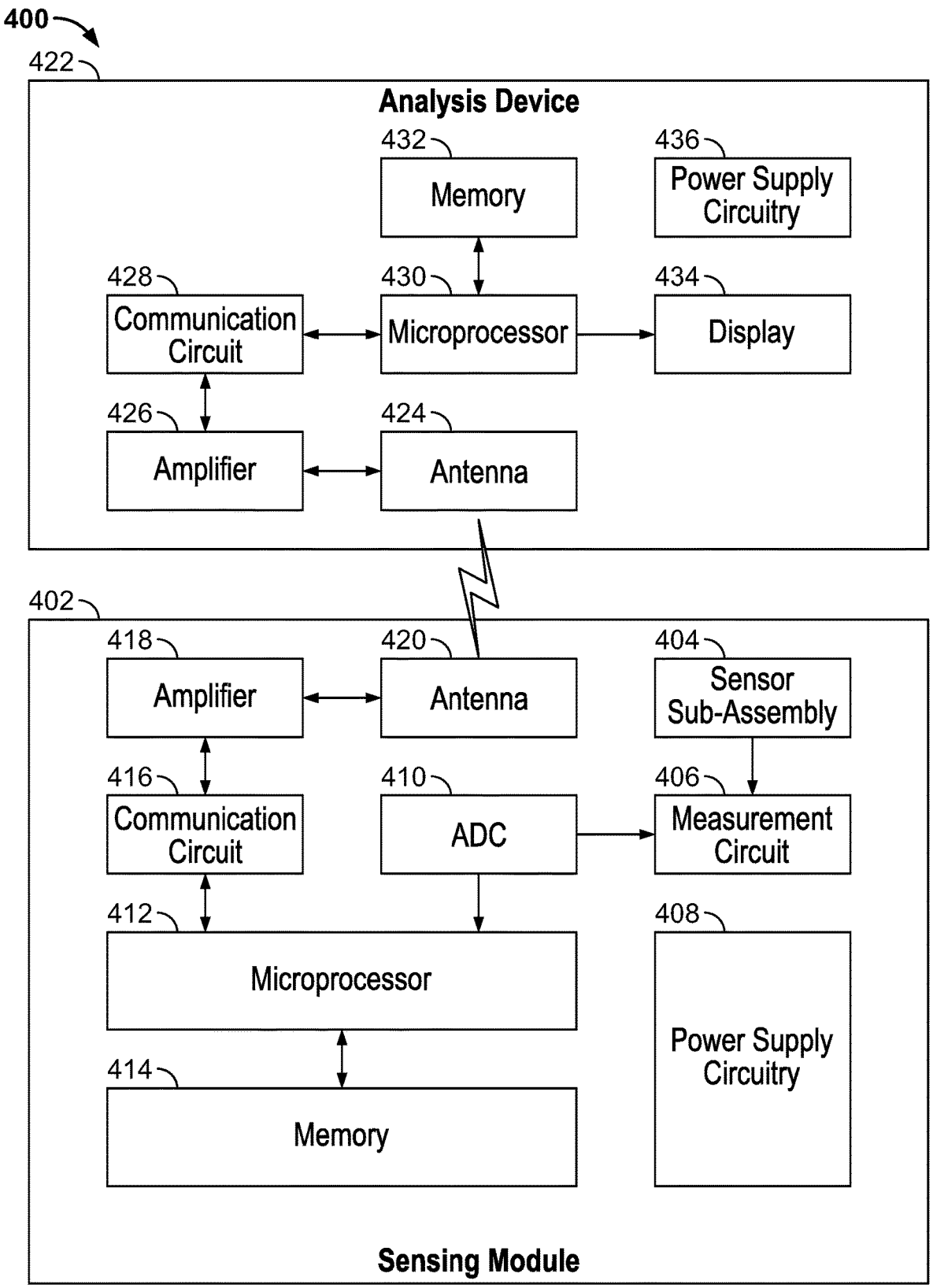
FIG. 13 is a block diagram depicting an example system implementing the sensors presently described.

Turning to FIG. 13, an example system 400 employing a sensor sub-assembly 404 (e.g., sensor sub-assemblies 130, 140, 170, 180, 190) as described above is depicted. The sensor sub-assembly 404 is disposed in a sensing module 402 configured to be worn or otherwise placed on a user or other body such that the sensor sub-assembly may sense temperature, strain, etc., as described above. The sensor sub-assembly 404 may in turn include one or more of the sensing elements (e.g., as in the networks depicted in FIGS. 11A-D) and, for each of the one or more sensing elements, one or more contacts. Accordingly, the sensor sub-assembly may have two or more contacts, some number of which will be reference contacts, and some number of which may be signal contacts. Of course, for each sensing element in the sensor sub-assembly 404, there will be at least one respective corresponding sensing contact, while several sensing elements may share a single reference contact. It is possible, however, as described above, for there to be more than a single sensing contact and a single reference contact for each sensing element.

The sensing module 402 also includes, in addition to the sensor sub-assembly 404, a variety of components that facilitate measurement of the resistance between contacts of the sensor sub-assembly 404 (e.g., the contacts 104A-B, 134A-B, 144A-B, 144C-D, 144A-C, etc.), the interpretation of the measurements, and the communication of that and other data to one or more other devices. In particular, the sensing module 402 includes a measurement circuit 406 electrically coupled to contacts of the sensor sub-assembly 404 so as to measure the resistance across one or more sensing elements in the sensor sub-assembly 404. In general, the measurement circuit 406 may include a circuit similar to the circuit 300 depicted in FIG. 12 (exclusive of the sensing element 302). While a single measurement circuit 406 is illustrated in FIG. 13, the sensing module could include a complex circuit capable of measuring each pair of contacts necessary to determine the resistances of all of the sensing elements in the sensor sub-assembly 404, or may alternatively include multiple instances of a simple circuit capable of measuring a single pair of contacts to determine the resistance of a single sensing element. The measurement circuit 406 may include a voltage source (e.g., the voltage source 306) or may receive a voltage from power supply circuitry 408 providing power to various elements of the sensing module 402.

An analog-to-digital converter (ADC) 410 of the sensing module 402 receives analog signals from the measurement circuit 406 and converts the analog signals (e.g., by sampling) into digital signals for processing by a microprocessor 412. The ADC 410 may also be powered by the power supply circuitry 408. While depicted in FIG. 13 as an element separate from the measurement circuit 406, the ADC 410 may, in embodiments, be incorporated into the measurement circuit 406, such that the measurement circuit 406 provides a digital output directly to the microprocessor 412.

The microprocessor 412, in cooperation with one or more routines stored on a memory device 414, receives and/or stores data from the ADC 410, communicates that data (as described below) to other devices, and may, in embodiments perform analysis and/or signal processing on the data received from the ADC 410. In various embodiments, the microprocessor 412 may execute routines (stored on the memory 414) to remove noise from the data received from the ADC 410, may compress data received from the ADC 410 in order to facilitate more efficient storage of the data and/or transfer of the data to another device, may package the data for transmission to another device, scale the data, etc. As should be understood, the microprocessor 412 and/or the memory may receive power from the power supply circuitry 408. Additionally, while the memory 414 and the microprocessor 412 are depicted in FIG. 13 as separate devices, it should be understood that the memory 414 may be on-board memory of the microprocessor 412.

The microprocessor 412 may be communicatively coupled to various communication devices and, in particular, wireless communication devices including a communication circuit 416 (e.g., a transceiver), an amplifier 418, and an antenna 420. Of course, there is no requirement that the sensing module 402 communicate wirelessly with other devices; the sensing module 402 may instead communicate via one or more wired connections (not shown), in which case an antenna may be replaced with a port for a physical (i.e., wired) connection. Additionally, it should be understood that the one or more of the antenna 420, the amplifier 418, the communication circuit 416, the microprocessor 412, and/or the memory 414 may be combined in various combinations as one or more chipsets. All of the components may receive necessary power from the power supply circuitry 408, which, while illustrated as a single component, may be multiple components and/or circuits within the sensing module 402.

The sensing module 402 may communicate with one or more analysis devices 422. Each analysis device 422 may be configured with communication devices (e.g., an antenna 424, an amplifier 426, a communication circuit 428 (e.g., a transceiver) for communicating with the corresponding equipment in the sensing module 402 (e.g., the antenna 420, the amplifier 418, and the communication circuit 416). The analysis device 422 may likewise have a microprocessor 430 and a memory device 432, which may cooperate to execute routines, stored on the memory device 432 and executed by the microprocessor 430, configured to perform analysis and/or display (via a display 434) of the data received from the sensing module 402. The devices 424-434 of the analysis device 422 may all be powered by power supply circuitry 436 associated with the analysis device 422. Of course, one or more intermediate nodes (not shown) may be present in the communication path between the antenna 420 and the antenna 424 (or between the physical ports connecting the analysis device 422 to the sensing module 402). By way of example, where the analysis device 422 communicates with the sensing module 402 by a wireless internet protocol (e.g., one of the protocols in the IEEE 802.11 family), there may be intermediate access point nodes, relay nodes, wireless router nodes, etc. Correspondingly, where the analysis device 422 communicates with the sensing module 402 by a wired protocol, there may be intermediate switches, routers, etc.

The following list of aspects reflects a variety of the embodiments explicitly contemplated by the present application. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A sensor module comprising: a first contact; a second contact; and a sensing element made from an iono-conductive material having a conductivity that varies at least in response to variations in an environmental factor, wherein the sensing element is electrically coupled to the first contact and to the second contact, wherein a first resistance of the sensing element, measured between the first contact and the second contact, varies in response to the variations in the environmental factor.

2. A sensor module according to aspect 1, wherein the environmental factor is one of the group consisting of: temperature, humidity, spectral irradiance, atmospheric pressure, and partial vapor pressure of a chemical solvent.

3. A sensor module according to aspect 2, wherein the chemical solvent is one or more of the group consisting of: ethanol, methanol, isopropanol, acetone, ethyl acetate, and a water-miscable solvent.

4. A sensor module according to aspect 2, wherein the spectral irradiance is from an ultraviolet light.

5. A sensor module according to aspect 1, further comprising an encapsulation layer that encapsulates a first portion of the sensing element that extends between the first contact and the second contact, the encapsulation layer impervious to moisture.

6. A sensor module according to any one of the preceding aspects, further comprising a substrate, wherein the first contact and the second contact are both disposed on the substrate.

7. A sensor module according to any one of the preceding aspects, further comprising a third contact disposed on a second substrate, the third contact electrically coupled to the sensing element, wherein a second resistance of the sensing element, measured between the first contact and the third contact, varies in response to strain or deformation of a second portion of the sensing element extending between the first contact and the third contact.

8. A sensor module according to aspect 7, further comprising an encapsulation layer that encapsulates a second portion of the sensing element that extends between the first contact and the third contact, the encapsulation layer exhibiting the property of elasticity.

9. A sensor module according to aspect 1, further comprising: a first substrate on which the first contact and the second contact are disposed; a third contact; a fourth contact; a second substrate on which the third contact and the fourth contact are disposed; and an encapsulation layer; wherein the sensing element is electrically coupled to the third contact and to the fourth contact; wherein the first resistance of the sensing element, measured between the first contact and the second contact, varies in response to variations in temperature; wherein a second resistance of the sensing element, measured between the first contact and the third contact, varies in response to strain or deformation of a second portion of the sensing element extending between the first contact and the third contact; wherein a third resistance of the sensing element, measured between the third contact and the fourth contact, varies in response to humidity experienced by a third portion of the sensing element extending between the third contact and the fourth contact; and wherein the encapsulation layer encapsulates the first and second portions, but does not encapsulate the third portion.

10. A sensor module according to any one of the preceding aspects, wherein the iono-conductive material is an elastomer.

11. A sensor module according to any one of the preceding aspects, wherein the iono-conductive material is (i) ionic gel or (ii) hydrogel.

12. A sensor module according to any one of the preceding aspects, wherein the iono-conductive material is (i) F127-DA/d$_3$EAN or (ii) F127-DA/hEAN.

13. A sensor module according to any one of aspects 7 to 12, wherein the strain or deformation is an elastic deformation along a longitudinal axis of the second portion.

14. A sensor module according to any one of aspects 7 to 13, wherein the strain or deformation is an elastic deformation perpendicular to a longitudinal axis of the second portion.

15. A sensor module according to any one of aspects 6 to 14, wherein the substrate material is polyethylene terephthalate (PET).

16. A sensor module according to any one of aspects 6 to 15, wherein the substrate material is one the group consisting of: ceramic, polyethylene terephthalate (PET), polymer film, thermoplastic volcanizates (TPV), polyethylene, polypropylene, polyimide, Teflon™, and Nylon.

17. A sensor module according to any one of aspects 5 to 16, wherein the encapsulation layer comprises a VHB tape.

18. A sensor module according to any one of the preceding aspects, wherein the contact material comprises graphite.

19. A sensor module according to any one of the preceding aspects, wherein the contact material is one of the group consisting of: graphite, graphene, or carbon black.

20. A sensor module according to any one of the preceding claims, wherein a voltage applied between the first contact and the second contact is an AC signal.

The invention claimed is:

1. A sensor module comprising:
a first contact;
a second contact;
a third contact; and
one or more sensing elements electrically coupling the first contact, the second contact, and the third contact, the one or more sensing elements made from an iono-elastomer having a conductivity that varies at least in response to changes in strain or deformation and variations in an environmental factor,
wherein the sensor module is configured to measure respective conductivities between two or more pairs of the contacts, at least one of the conductivities corresponding to a respective first environmental factor, and each other of the conductivities corresponding to a respective second environmental factor, a respective strain, or a respective deformation.

2. A sensor module according to claim 1, wherein a first conductivity of the one or more sensing elements, measured between the first contact and the second contact, varies in response to one of: temperature, humidity, spectral irradiance, atmospheric pressure, and partial vapor pressure of a chemical solvent.

3. A sensor module according to claim 2, wherein the spectral irradiance is from an ultraviolet light.

4. A sensor module according to claim 1, wherein a first conductivity of the one or more sensing elements, measured between the first contact and the second contact, varies in response to partial vapor pressure of a chemical solvent that is one or more of: ethanol, methanol, isopropanol, acetone, ethyl acetate, and a water-miscible solvent.

5. A sensor module according to claim 1, further comprising an encapsulation layer that encapsulates a first portion of the one or more sensing elements that extends between the first contact and the second contact, the encapsulation layer impervious to moisture.

6. A sensor module according to claim 5, further comprising:
a first substrate on which the first contact and the second contact are disposed;
a fourth contact;
a second substrate on which the third contact and the fourth contact are disposed; and
an encapsulation layer;
wherein the one or more sensing elements are further electrically coupled to the fourth contact;
wherein the first conductivity of the one or more sensing elements, measured between the first contact and the second contact, varies in response to variations in temperature;
wherein a second conductivity of the one or more sensing elements, measured between the first contact and the third contact, varies in response to strain or deformation of a second portion of the sensing element extending between the first contact and the third contact;
wherein a third conductivity of the one or more sensing elements, measured between the third contact and the fourth contact, varies in response to humidity experienced by a third portion of the sensing element extending between the third contact and the fourth contact; and
wherein the encapsulation layer further encapsulates the second portion of the one or more sensing elements, but does not encapsulate the third portion of the one or more sensing elements.

7. A sensor module according to claim 5, wherein the encapsulation layer comprises a deformable acrylic elastomer tape.

8. A sensor module according to claim 1, further comprising a first substrate, wherein the first contact and the second contact are both disposed on the first substrate.

9. A sensor module according to claim 8, wherein the third contact is disposed on a second substrate, and wherein a second conductivity of the one or more sensing elements, measured between the first contact and the third contact, varies in response to strain or deformation of a portion of the one or more sensing elements extending between the first contact and the third contact.

10. A sensor module according to claim 9, further comprising an encapsulation layer that encapsulates the portion of the one or more sensing elements that extends between the first contact and the third contact, the encapsulation layer exhibiting the property of elasticity.

11. A sensor module according to claim 9, wherein the second conductivity of the one or more sensing elements varies in response to strain or deformation that is an elastic deformation along a longitudinal axis of the portion of the one or more sensing elements extending between the first contact and the third contact.

12. A sensor module according to claim 9, wherein the second conductivity of the one or more sensing elements varies in response to strain or deformation that is an elastic deformation perpendicular to a longitudinal axis of the portion of the one or more sensing elements extending between the first contact and the third contact.

13. A sensor module according to claim 8, wherein the first substrate is polyethylene terephthalate (PET).

14. A sensor module according to claim 8, wherein the first substrate includes one of: ceramic, polyethylene terephthalate (PET), polymer film, thermoplastic volcanizates (TPV), polyethylene, polypropylene, polyimide, polytetrafluoroethylene, and Nylon.

15. A sensor module according to claim 1, wherein the iono-elastomer is (i) ionic gel or (ii) hydrogel.

16. A sensor module according to claim 1, wherein the iono-elastomer is (i) F127-DA/$d_3$EAN or (ii) F127-DA/hEAN.

17. A sensor module according to claim 1, wherein the first contact, the second contact, and the third contact each include graphite.

18. A sensor module according to claim 1, wherein the first contact, the second contact, and the third contact each are one of the group consisting of: graphite, graphene, or carbon black.

19. A sensor module according to claim 1, wherein a voltage applied between the first contact and the second contact is an AC signal.

* * * * *